(12) United States Patent
Kim et al.

(10) Patent No.: US 9,484,327 B2
(45) Date of Patent: Nov. 1, 2016

(54) PACKAGE-ON-PACKAGE STRUCTURE WITH REDUCED HEIGHT

(71) Applicant: QUALCOMM Incorporated, San Diego, CA (US)

(72) Inventors: Chin-Kwan Kim, San Diego, CA (US); Omar James Bchir, San Diego, CA (US); Milind Pravin Shah, San Diego, CA (US); Marcus Bernard Hsu, San Diego, CA (US); David Fraser Rae, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/833,921

(22) Filed: Mar. 15, 2013

(65) Prior Publication Data

US 2014/0264946 A1 Sep. 18, 2014

(51) Int. Cl.
*H01L 23/48* (2006.01)
*H01L 23/52* (2006.01)
*H01L 29/40* (2006.01)
*H01L 25/065* (2006.01)
(Continued)

(52) U.S. Cl.
CPC ......... *H01L 25/0657* (2013.01); *H01L 21/563* (2013.01); *H01L 23/49816* (2013.01); *H01L 23/49827* (2013.01); *H01L 23/49833* (2013.01); *H01L 23/5389* (2013.01); *H01L 24/82* (2013.01); *H01L 25/03* (2013.01); *H01L 25/105* (2013.01); *H01L 25/50* (2013.01); *H01L 23/3135* (2013.01); *H01L 24/16* (2013.01); *H01L 24/32* (2013.01); *H01L 24/48* (2013.01); *H01L 24/73* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73253* (2013.01); *H01L 2224/73265* (2013.01); *H01L 2225/1023* (2013.01); *H01L 2225/1058* (2013.01); *H01L 2225/1088* (2013.01); *H01L 2924/12042* (2013.01); *H01L 2924/15151* (2013.01); *H01L 2924/15311* (2013.01); *H01L 2924/15331* (2013.01); *H01L 2924/181* (2013.01); *H01L 2924/18161* (2013.01); *H01L 2924/18165* (2013.01)

(58) Field of Classification Search
None
See application file for complete search history.

(56) References Cited

U.S. PATENT DOCUMENTS 6,734,535 B1 * 5/2004 Hashimoto ............ 257/668
7,408,254 B1 * 8/2008 Kim et al. ............ 257/686
(Continued)

FOREIGN PATENT DOCUMENTS

JP 2007123705 A 5/2007

OTHER PUBLICATIONS

International Search Report and Written Opinion—PCT/US2014/023626—ISA/EPO—Jun. 3, 2014.

*Primary Examiner* — Mohammad Islam
*Assistant Examiner* — Jay C Chang
(74) *Attorney, Agent, or Firm* — Loza & Loza, LLP

(57) ABSTRACT

To achieve a package-on-package having an advantageously reduced height, a first package substrate has a window sized to receive a second package die. The first package substrate interconnects to the second package substrate through a plurality of package-to-package interconnects such that the first and second substrates are separated by a gap. The second package die has a thickness greater than the gap such that the second package die is at least partially disposed within the first package substrate's window.

10 Claims, 6 Drawing Sheets

(51) Int. Cl.
*H01L 23/00* (2006.01)
*H01L 21/56* (2006.01)
*H01L 25/03* (2006.01)
*H01L 25/10* (2006.01)
*H01L 25/00* (2006.01)
*H01L 23/498* (2006.01)
*H01L 23/538* (2006.01)
*H01L 23/31* (2006.01)

(56) References Cited

U.S. PATENT DOCUMENTS

| | | | |
|---|---|---|---|
| 7,687,899 B1 * | 3/2010 | Berry | 257/687 |
| 7,883,936 B2 | 2/2011 | Palaniappan et al. | |
| 8,084,850 B2 | 12/2011 | Shin | |
| 2006/0231938 A1 * | 10/2006 | Mangrum | H01L 23/367 257/686 |
| 2006/0267175 A1 | 11/2006 | Lee et al. | |
| 2008/0157330 A1 | 7/2008 | Kroehnert et al. | |
| 2008/0237833 A1 * | 10/2008 | Hsu | H01L 21/568 257/691 |
| 2009/0166886 A1 | 7/2009 | Kim et al. | |
| 2010/0327419 A1 | 12/2010 | Muthukumar et al. | |
| 2011/0298119 A1 | 12/2011 | Cho et al. | |
| 2012/0018877 A1 | 1/2012 | Yang et al. | |
| 2012/0119388 A1 | 5/2012 | Cho et al. | |
| 2012/0231281 A1 * | 9/2012 | Hirai | C09D 1/00 428/447 |
| 2012/0241925 A1 * | 9/2012 | Yoon et al. | 257/666 |

* cited by examiner

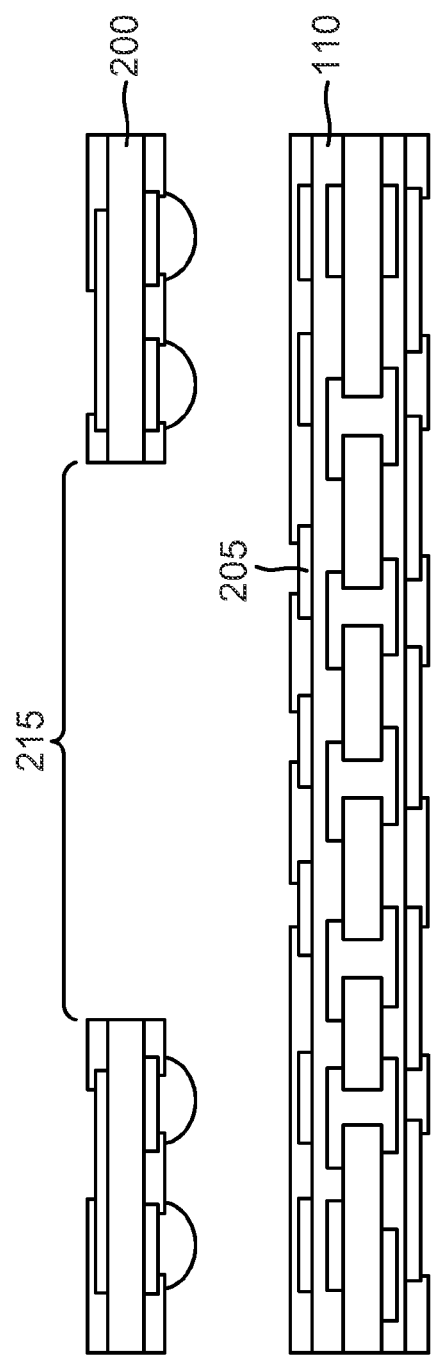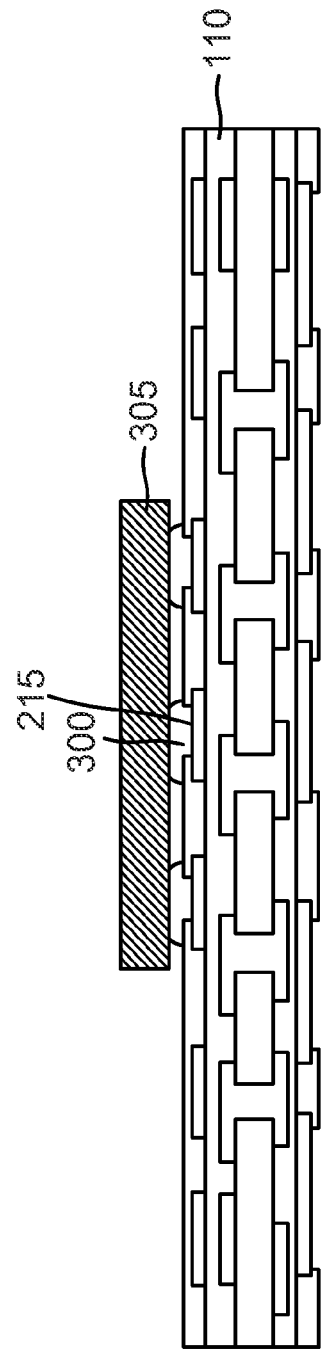

PACKAGE-ON-PACKAGE STRUCTURE WITH REDUCED HEIGHT

TECHNICAL FIELD

This application relates to integrated circuit packaging, and more particularly to a package-on-package (PoP) structure in which the top package substrate is modified for reduced package height.

BACKGROUND

Package-on-package (PoP) structures have been developed for applications such as cellular telephones and other portable devices in which circuit board space must be conserved. The top package is typically a memory package whereas the bottom package is commonly a processor package. Package-on-package technology has proven to be quite popular as compared to other approaches such a stacked-die circuit. For example, a manufacturer can readily substitute different memory packages in a PoP circuit, which thus lowers costs as opposed to being tied to a particular memory. Moreover, the top and bottom packages may be tested independently. In contrast, a bad die in a stacked-die design requires rejection of the remaining good die.

Although the packaging of integrated circuits using PoP structures is thus quite popular, challenges remain in this packaging process. For example, as technology advances, users desire a reduced thickness or height to the PoP stack. But despite the technological advances in the PoP arts, obstacles remain with regard to reducing the PoP stack height. The problems with regard to reducing the package height may be better understood with reference to FIGS. 1A and 1B. FIG. 1A shows a conventional PoP stack 100. To construct PoP 100, a bottom package die 105 is first flip-chip mounted to a bottom package substrate 110 and encapsulated with a mold compound layer 108. Vias are then formed in molding compound layer 108 such as through laser ablation to expose lower solder balls on bottom package substrate 110. Corresponding upper solder balls on a top package substrate 120 are then received in the vias, whereupon a reflow process forms solder joint interconnects 115 from the reflowed upper and lower solder balls to electrically couple top package substrate 120 to bottom package substrate 110.

Because of the through-mold-via process used to form PoP 100, there is a gap 140 between a lower surface of top package substrate 120 and an upper surface of mold compound layer 108. Gap 140 thus increases a PoP stack height for PoP 100. To achieve a reduced stack height that does not suffer from gap 140, an alternative PoP architecture has been developed that may be denoted as a molded-embedded (ME) PoP 130 as shown in FIG. 1B. In ME-PoP 130, mold compound 108 is applied after top package substrate 120 and lower package substrate have been joined through interconnects 115. In this fashion, ME-PoP 130 does not have a gap 140 between the bottom surface of top package substrate 120 and an upper surface for mold compound 108. Me-PoP 130 thus has a reduced height as compared to PoP 100. But regardless of which architecture is chosen, it can be seen that the bottom surface of top package substrate 120 is always above the top surface of bottom die 105 since top package substrate 120 covers bottom die 105. In other words, top package substrate 120 is stacked with regard to bottom die 105. The thickness of top package substrate 120 is thus a direct factor in the height of the overall PoP stack.

If the thickness of the top package substrate in a conventional PoP can be thinned by some number of microns, the height of the PoP is then reduced by the same number of microns. Similarly, a reduction in the thickness for the bottom package substrate also reduced the PoP stack height. The substrates for the top and bottom packages have thus been progressively thinned to obtain reduced PoP stack height. But current state-of-the-art organic substrates can be thinned to no less than approximately 80 to 90 microns. If the substrates are made any thinner than this minimum thickness, unacceptable warping occurs. So the minimum package substrate thickness for the top and bottom package substrate acts to thwart further advances in PoP stack height reduction.

Accordingly, there is a need in the art for improved PoP circuits having reduced height while still having robust protection against substrate warpage.

SUMMARY

To achieve a reduced PoP stack height, a PoP is provided in which a package substrate for one of the packages includes a window sized to receive a die from a remaining package. Although this substrate window is provided in what is commonly denoted as the top or upper package substrate, the top package is referred to herein as the first package. The remaining package, which would typically be denoted as the bottom package, is referred to herein as the second package. In that regard, the art-recognized terms of "top package" and "bottom package" do not switch definitions if a PoP is flipped upside down. But to avoid any ambiguity, the top package is referred to herein as the first package whereas the bottom package is referred to as the second package. The first package includes at least one first package die and a window-containing first package substrate. The second package includes a second package die and a second package die. A plurality of package-to-package interconnects interconnect the first package substrate to the second package substrate such that the first and second package substrates are separated by a gap. The second package die has a thickness or height greater than the gap such that the second package die is at least partially disposed within the first package substrate's window.

BRIEF DESCRIPTION OF THE DRAWINGS

FIG. 2 is cross-sectional view of the first package substrate and the second package substrate for an embodiment of a reduced-height PoP.

FIG. 3 is a cross-sectional view of the second package substrate of FIG. 2 with a surface-mounted second package die to form a second package.

DETAILED DESCRIPTION

To address the need in the art for improved PoP architectures having reduced stack height while still resisting warpage, a PoP stack is disclosed that includes a first package substrate having a window sized to receive a second package die. As used herein, the first package substrate window is said to "receive" the second package die in that, after the first package substrate has been coupled to the second package substrate, the second package die is disposed at least partially within the first package substrate's window.

Overview

The first package substrate includes pads that are coupled through package-to-package interconnects to corresponding pads on the second package substrate. Given such package-to-package interconnects to pads on the first package substrate, a "first package die" is defined herein to be a die whose input/output (I/O) signals are conducted through the first package substrate pads. In other words, the definition of a "first package die" as used herein excludes a die in a through-silicon-stacking (TSS) arrangement with a second package die or a die that is wire bonded to a second package substrate. For example, the I/O signals for a die that is in a TSS stack with a second package die would be conducted in pads on the top die itself as opposed to first package substrate pads. Similarly, the I/O signals for a die that is wire bonded to the second package substrate would not be conducted through first package substrate pads but instead through the wire bonds to the second package substrate. But it will be appreciated that such a definition of a "first package die" would not exclude first package dies stacked together in a TSS stack through the use of through silicon vias (TSVs) so long as the I/O for these dies is conducted through pads on the first package substrate.

Figure 1A:
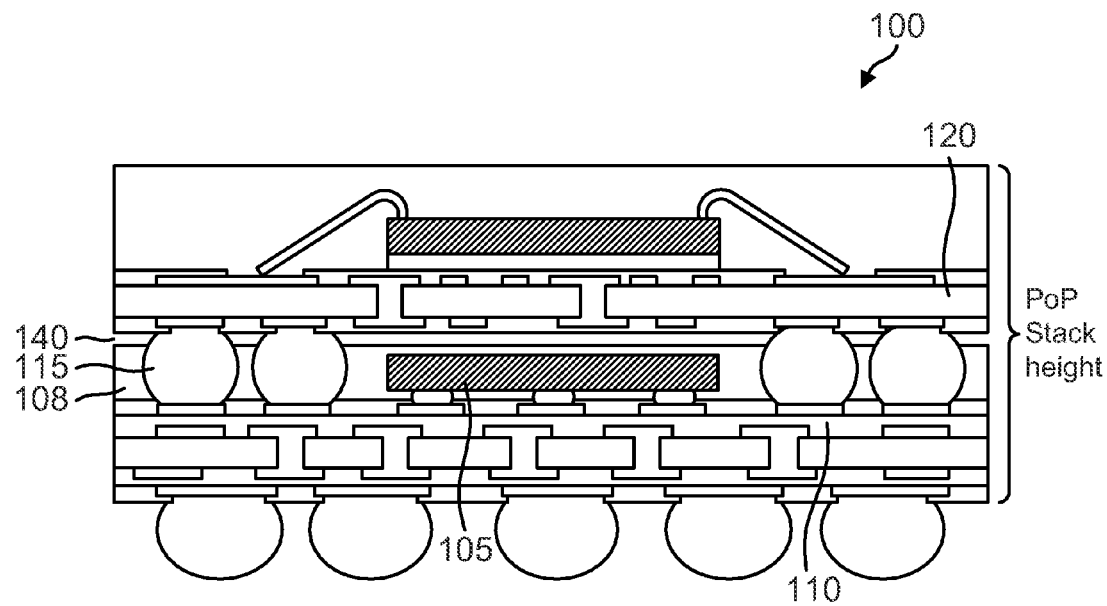
FIG. 1A is a cross-sectional view of a conventional package-on-package (PoP) stack.
Figure 1B:
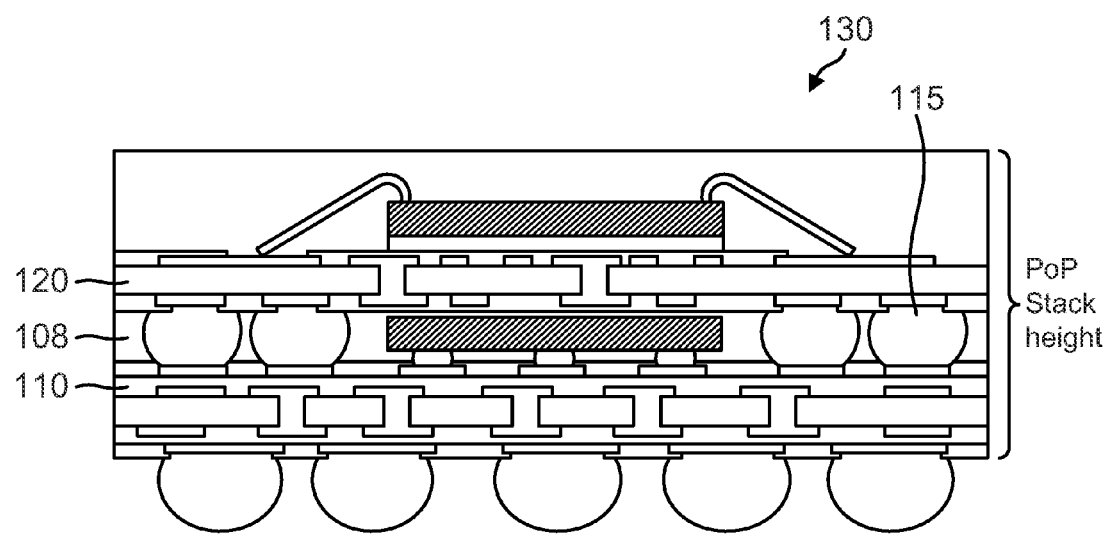
FIG. 1B is a cross-sectional view of a conventional molded-embedded PoP stack.

Because of the package-to-package interconnects coupling between the first package substrate and the second package substrate, the first and second package substrates do not contact each other but are instead spaced apart by a gap as is conventional in the PoP arts. In the prior art, the second package die could not have a height (which may also be denoted as a thickness) that would exceed the gap because the first package substrate is stacked over the second package die. For example, referring again to FIGS. 1A and 1B, if die 105 is increased in height, the gap between substrates 110 and 120 would then be increased accordingly. Since substrate 120 is stacked over die 105, the thickness of die 105 and the thickness of substrate 120 are direct factors in the resulting PoP stack height. In contrast, because the first package substrate disclosed herein has a window that receives the second package die, the first package substrate thickness and the second package die thickness no longer directly combine to affect the resulting PoP stack height. This is quite advantageous in that the second package die no longer needs to be excessively thinned to reduce the PoP stack height. Such die thinning leads to reliability problems and increases manufacturing costs. But the second package die disclosed herein is received in the window in the first package substrate. The second package die can thus have a thickness greater than the gap separating the first and second package substrates. Because of this height for the second package die, there is a portion of the second package die that extends past the gap. The window acts as a means for receiving this portion of the second package die. This received portion of the second package die then plays no part in contributing to the PoP stack height. Moreover, if a combination of the second package die height and a thickness of the interconnects coupling the second package die to the second package substrate is less than or equal to a combination of the gap between the first and second package substrates and the first package substrate thickness, the second package die height has no effect on the resulting PoP stack height. In this fashion, the second package die may have a robust thickness for reliability and lower cost yet the PoP can still have an advantageously reduced stack height.

In addition, since the gap between the first and second package substrates no long needs to accommodate the height of the second package substrate, the manufacture of the package-to-package interconnects for coupling the package substrates to each other is simplified. In the prior art, the package-to-package interconnects needed to form joints that would span the height of the second package die. Accomplishing such a span as the pitch of the package-to-package interconnects is reduced complicates conventional PoP manufacture. But the package-to-package interconnects disclosed herein need not span the height of the second package die, which lowers costs as the interconnect pitch is reduced.

Figure 7:
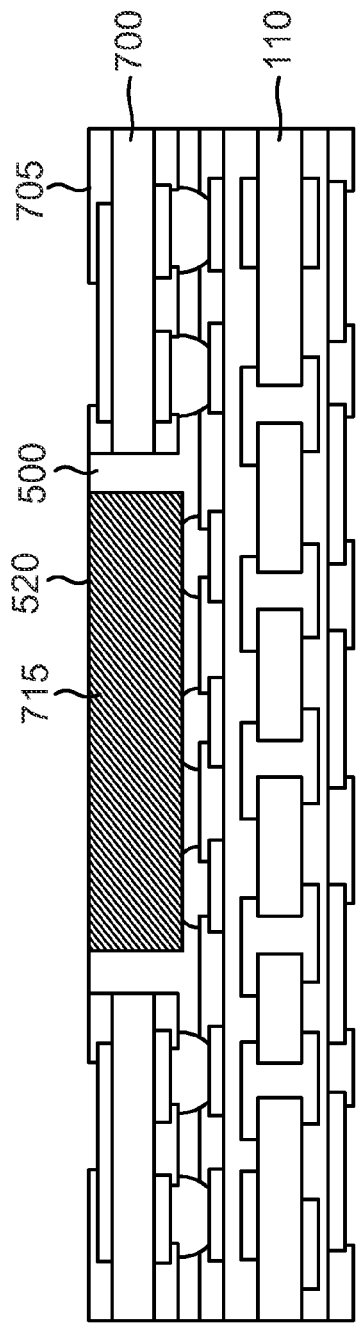
FIG. 7 is a cross-sectional view of an alternative embodiment of a partial PoP assembly.
Figure 8:
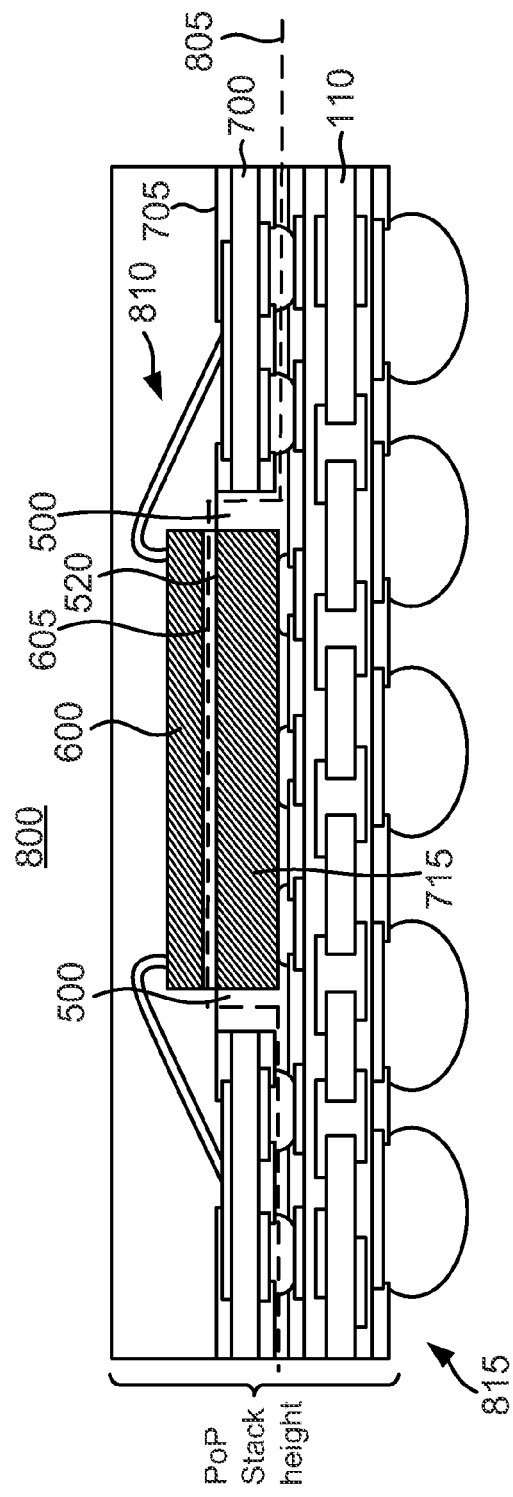
FIG. 8 is a cross-sectional view of a reduced-height PoP including the partial PoP assembly of FIG. 7.

In one embodiment, the second package die has a height compared to the first package substrate thickness such that the second package die extends only partially into the window in the first package substrate. In such an embodiment, the second package die may be encapsulated with mold compound so that the encapsulating mold compound is exposed in the window. In an alternative embodiment, the second package die is fully disposed within the window. In this embodiment, the fully-disposed second package die may have a surface exposed within the window such that its exposed surface is not encapsulated with mold compound. These alternative embodiments for the improved PoP stack disclosed herein may be better understood with reference to FIGS. 2-8. FIGS. 2-5 illustrate various steps in the manufacture of a PoP 620 shown in FIG. 6. PoP 620 is an example of an encapsulated second package die embodiment. In contrast, a PoP 800 of FIG. 8 is an example of an exposed second package die embodiment. FIG. 7 illustrates a step in the manufacture of a PoP 800. PoP 620 will be discussed first, followed by a discussion of PoP 800.

An Encapsulated Second Package Die Embodiment

Figure 6:
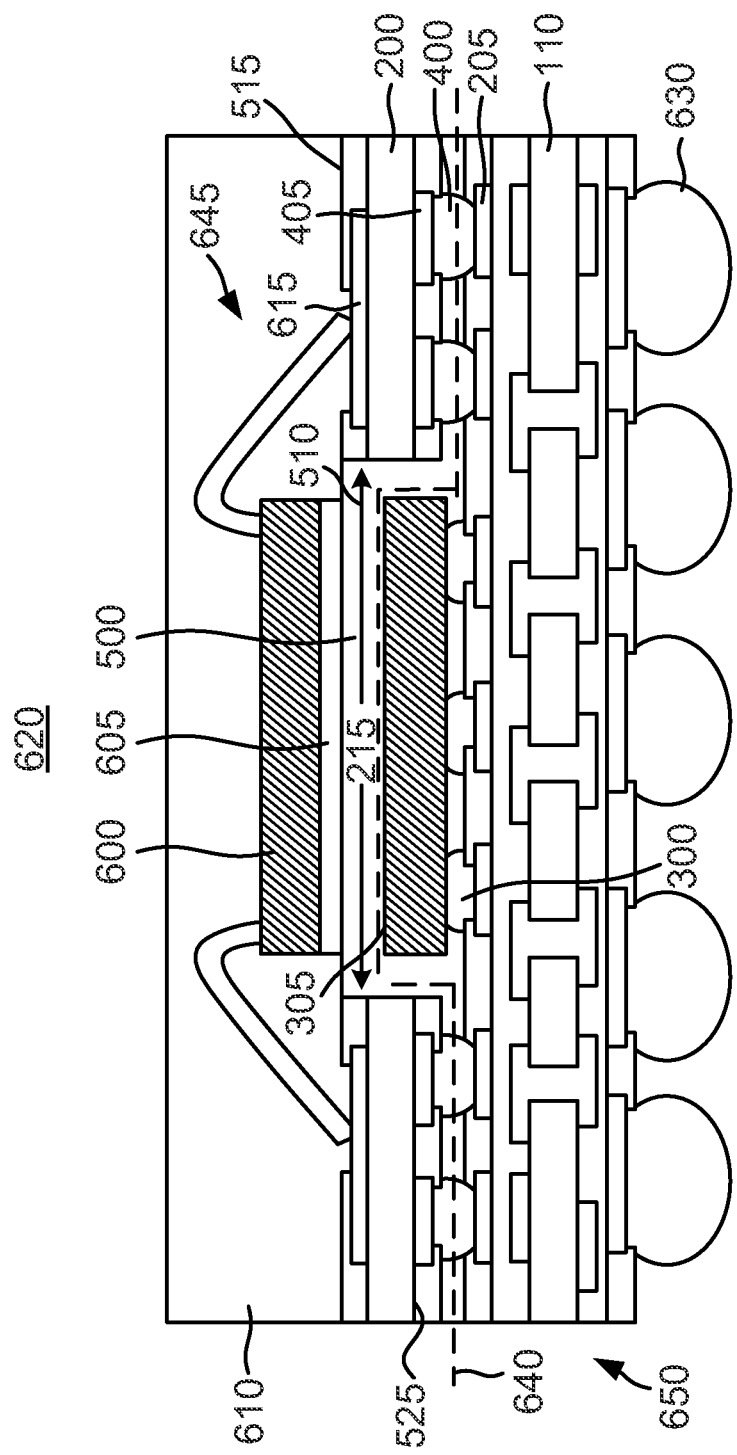
FIG. 6 is a cross-sectional view of a reduced-height PoP including the partial PoP assembly of FIG. 5.

PoP 620 of FIG. 6 is an example of an encapsulated second package die embodiment. In FIG. 6, a dashed line 640 is provided to represent the demarcation between a first package 645 and a second package 650. In contrast to prior art PoPs 100 and 130 of FIGS. 1A and 1B, such a demarcation is not planar. This non-planar demarcation between the packages results from a second package die 305 being partially received within a window 215 in a first package substrate 200. In this embodiment, second package die 305 is surface mounted onto a second package substrate 110 through flip-chip bumps 300 as is conventional in the PoP arts. But it will be appreciated that alternative surface mount technologies such as wire bonding may be used for second package die 105.

In first package 645, a first package die 600 interconnects through wire bond interconnects to pads 615 on a surface 515 of first package substrate 200. In turn, pads 615 couple through vias (not shown) in first package substrate 200 to pads 405 on an opposing second-package-facing surface 525 of first package substrate 200. Pads 405 interconnect through package-to-package interconnects 400 to pads 205 on second package substrate 110. It may thus be seen that first package die 600 satisfies the definition given earlier for a "first package die" in that the I/O signaling for first package die 600 will be conducted through pads 615 (as well as pads 405 and package-to-package interconnects 400).

A height for second package die 305 is less than a thickness for first package substrate 200. In such an embodiment, second package die 305 extends only partially through window 215. More generally, such a partial extension occurs whenever a height for second package die 305 in combination with a thickness for bumps 300 is less than a combination of a thickness for first package substrate 200 and interconnects 400. Because of its partial extension into window 215, second package die 305 is encapsulated with mold compound 500 such that a surface 510 of mold compound 500 (instead of second package die 305) is exposed within window 215. First package die 600 attaches to the exposed mold surface 510 within window 215 through, for example, a bond pad 605.

An Exposed Second Package Die Embodiment

PoP 800 of FIG. 8 is an example of an exposed second package die embodiment. PoP 800 includes a first package 810 and a second package 815 whose demarcation is represented by a dashed line 805. Analogous to first package 645, first package 810 includes a first package die 600 that is wire-bonded to a first package substrate 700. Second package 815 is also analogous to second package 650 discussed above in that second package 815 includes a second package die 715 surface mounted onto a second package substrate 110. However, second package die 715 in PoP 800 is relatively thicker than second package die 305 used in PoP 620. Indeed, the thickness for second package die 715 is such that a first-package-facing surface 520 for second package die 715 is flush or aligned with a first-package-die-facing surface 705 of first package substrate 700. Mold compound 500 in PoP 800 thus does not encapsulate second package die 715. Instead, surface 520 of die 715 is exposed in window 215. Bond pad 605 for first package die 600 attaches directly to this exposed surface 520 of second package die 715.

Example Methods of Manufacture

A method for manufacturing PoP 620 will be discussed first followed by a discussion of a method for manufacturing PoP 800. FIGS. 2 through 5 illustrate various steps in the construction of PoP 620. First package substrate 200 and second package substrate 110 are shown in isolation in FIG. 2 to better illustrate their features. Second package substrate 110 includes a plurality of pads 205 as is known in the PoP arts. In that regard, second package substrate 110 need not differ from conventional PoP bottom package substrates. In contrast to conventional PoP substrates, first package substrate 200 includes window 215 that is sized so as to receive the second package die as discussed further herein.

Given these PoP substrates, a manufacture of a resulting PoP stack may proceed as shown for an initial process step in FIG. 3. In this step, an active surface for second package die 305 is interconnected to second package substrate 110 such as through flip-chip bumps 300 to pads 205 on second package substrate 110 to form a first package. But as discussed earlier, the PoP architectures disclosed herein include embodiments in which alternative surface mounting techniques are used for second package die 305 such as wire bonding. In a wire bonding embodiment, a non-active surface for second package die 305 would face second package substrate 110 instead of an active surface. However, window 215 would then need to be sized to not only receive second package die 305 but also to accommodate its wire bonds.

Accordingly, the following discussion will be directed to second package flip-chip embodiments such as shown in FIG. 3. The following discussion will also assume that the first package substrate 200 and second package substrate are organic substrates but it will be appreciated that alternative substrates may be used such as ceramic substrates.

Figure 4:
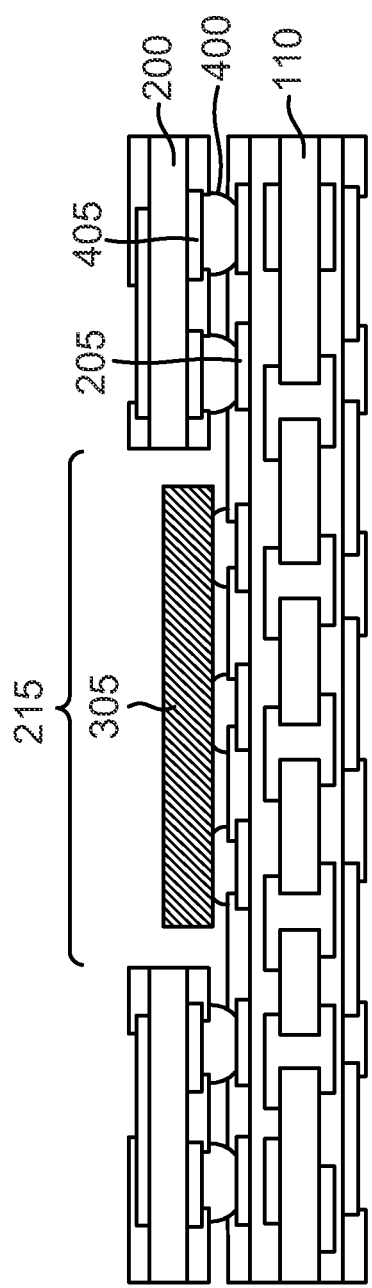
FIG. 4 is a cross-sectional view of the second package of FIG. 3 coupled to a first package substrate to form a partial PoP assembly.

A subsequent process step is shown in FIG. 4. In this process step, first package substrate 200 is interconnected through package-to-package interconnects 400 to second package substrate 110. Such an interconnection may occur prior to the application of any mold package as analogously performed during the manufacture of a conventional Me-PoP. Package-to-package interconnects 400 may comprise a variety of interconnect structures such as solder balls, bumps, micro-bumps, or pillars and are formed between pads 205 on second package substrate 110 and corresponding pads 405 on second package substrate 200. However, unlike a conventional ME-PoP process, second package die 305 is disposed at least partially within window 215 in first package substrate 200. The thickness or height of second package die 305 is thus no longer directly adds with the thickness for the first package substrate 200 in terms of increasing the PoP stack height. In contrast, the height for die 105 in PoP 100 and ME-PoP 130 discussed previously is a direct factor in the resulting package height.

Figure 5:
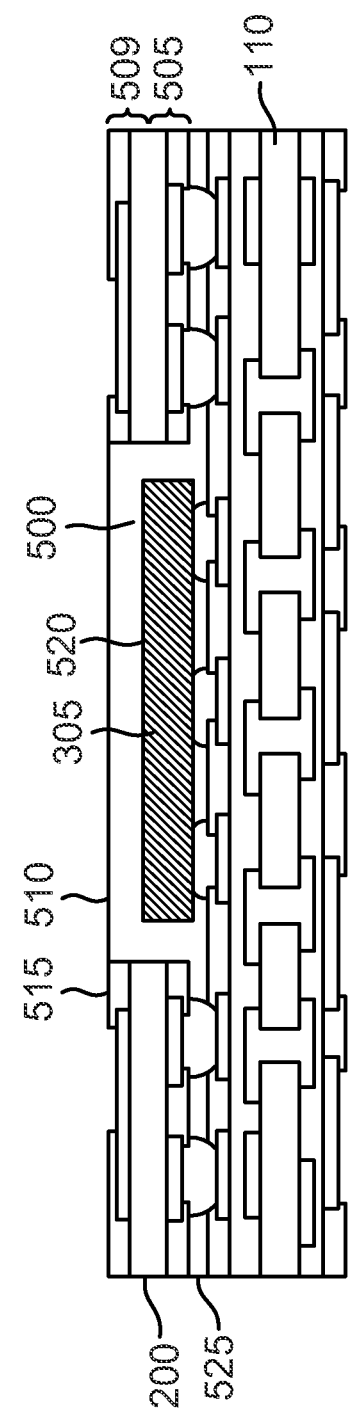
FIG. 5 is a cross-sectional view of the partial PoP assembly of FIG. 3 after application of mold compound.

This effect of window 215 in reducing the resulting PoP stack height may be better understood with reference to FIG. 5. In FIG. 5, a mold compound 500 has been applied to encase second package die 305 and package-to-package interconnects 400 to complete a partial PoP package assembly subsequent to the substrate-to-substrate interconnecting step discussed with regard to FIG. 4. Such a mold compound application is analogous to that performed in an ME-PoP manufacture process. Mold compound 500 is applied to encapsulate second package die 305 so as to have a surface 510 for mold compound 500 that is exposed within window 215 and aligned with first-package-die-facing surface 515 of first package substrate 200. Since second package die 305 is partially disposed within window 215, a height for second package die 305 as defined with respect to its surface 520 is greater than a package-to-package gap separating second-package-facing surface 525 for first package substrate 200 from an opposing surface of second package substrate 110. This is quite advantageous because a portion 505 of first package substrate 200 that does not extend past surface 520 of second package die 305 does not add to the resulting PoP stack height. Instead, only a portion 509 of first package substrate 200 between second package die surface 520 and first package substrate surface 515 adds to the resulting PoP stack height. In contrast, the entire thickness of top substrate 120 discussed with regard to FIGS. 1A and 1B directly contributes to the PoP stack height for conventional PoP 100 and ME-PoP 130. Moreover, first package substrate 200 need not be excessively thinned and is thus robust to warpage. For example, second package die 305 has a thickness greater than the package-to-package gap between first package substrate 200 and second package substrate 110. In conventional PoP 100 and ME-PoP 130, bottom package die 105 must have a thickness less than this gap. But window 215 enables the package-to-package gap between first package substrate 200 and second package substrate 110 to be less than the thickness of second package die 305. This is quite advantageous with regard to reducing the overall PoP stack height while maintaining robust resistance to warpage in second package substrate 200.

To complete the construction, a first package die 600 is attached though a bond pad 605 to exposed surface 510 of mold compound 500 in window 215 as shown in FIG. 6.

First package die 600 may then be interconnected through wire bond interconnects to pads 615 on first package substrate 200 and encapsulated in additional mold compound 610 to form reduced-height PoP 620. It will thus be appreciated that first package die 600 is configured to receive its input signals from an input set of pads 615 and also to drives its output signals into an output set of pads 615. Moreover, first package die 600 will receive its ground and power couplings from couplings to corresponding ones of pads 615. As known in the PoP arts, second package substrate 110 may then be mounted onto a circuit board (not illustrated) through bottom ball grid array (BGA) balls 630.

Not only does window 215 eliminate any height contribution from die-overlapping portion 505 of first package substrate 200, it also aids in reducing pitch as discussed above. In that regard, as pitch is reduced in conventional PoP 100, it becomes difficult to have interconnects 115 span across mold compound layer 108. A similar problem exists with regard to MEP-PoP 130 in that interconnects 115 must have a height sufficient to span across the height of bottom package die 105 yet be very close together due to the reduced pitch. The need for a sufficient height to interconnects 115 is opposed by the need for interconnects 115 to be relatively narrow to accommodate the fine pitch. But package-to-package interconnects 400 (FIG. 4) can be both narrow and short in that they do not need to span the height of second package die 305. In this fashion, reduced height PoP 620 also aids in achieving a finer pitch for package-to-package interconnects 400.

First package substrate 200 of FIGS. 2-6 is thicker than second package die 3105. Thus, as discussed with regard to FIG. 5, there is a non-overlapping portion 509 of top package substrate 200. This non-overlapping portion 509 contributes to the resulting PoP stack height for reduced-height PoP 620 just as does the entire thickness of conventional top substrate 120 discussed with regard to FIGS. 1A and 1B. Non-overlapping portion 509 is present because second package die 305 only partially extends into window 215 such that it is encapsulated with mold compound 500.

In an exposed second package embodiment such as discussed with regard to PoP 800 of FIG. 8, a second package die 715 is exposed within window 215. There will then be no analog to non-overlapping portion 509 of FIG. 5. The assembly process PoP 800 is largely similar to that used for PoP 620. The differences are better understood with reference to FIG. 7, which shows a partial assembly prior to attachment of the top package die for PoP 800 of FIG. 8. A first package substrate 700 is no thicker than second package die 715. Surface 520 for second package die 715 is thus flush with a first-package-die-facing surface 705 for top package substrate 700. Mold compound 500 is applied so as to leave surface 520 exposed and to fill the remaining cavity between first package substrate 700 and second package substrate 110. Because surface 520 of second package die 715 is aligned with surface 705 of first package substrate 700, there is no contribution to the resulting PoP stack height from the thickness for first package substrate 700. Indeed, in additional alternative embodiments, the thickness of first package substrate 700 may actually be thinner than second package die 715. But if first package substrate 700 is no thinner than second package die 715 such as shown in FIG. 7, the injection of mold compound 500 into the cavity between the substrates is more readily accomplished.

To complete the assembly of PoP 800, a first package die 600 is attached to surface 520 of second package die 715 through a bond pad 605 and interconnected through wire bond interconnects to first package substrate 700 in an analogous fashion as discussed with regard to FIG. 6. The resulting stack height for PoP 800 has thus been entirely decoupled from the thickness for first package substrate 700.

Example Electronic Systems

Figure 9:
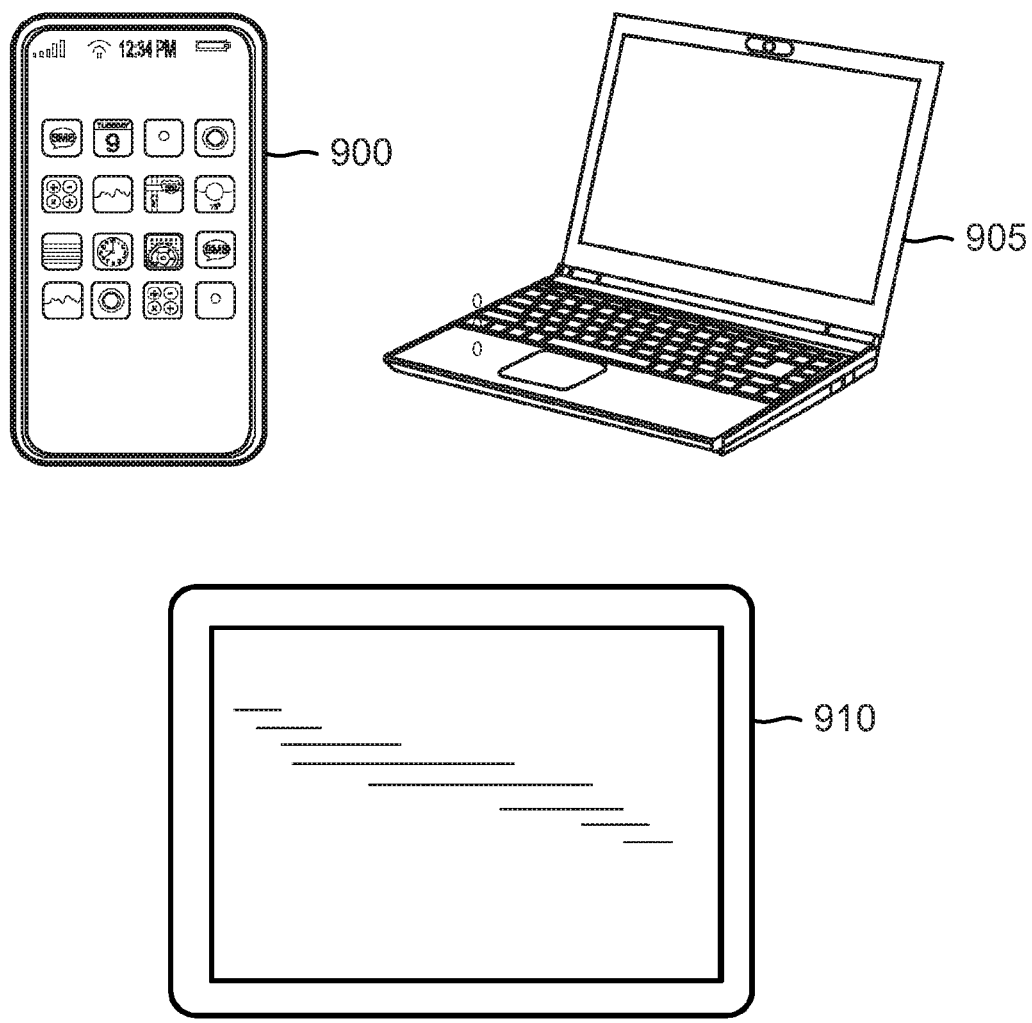
FIG. 9 illustrates a plurality of electronic systems incorporating a reduced-height PoP in accordance with embodiments disclosed herein.

The reduced-height PoP architectures disclosed herein may be incorporated into a wide variety of electronic systems. For example, as shown in FIG. 9, a cell phone 900, a laptop 905, and a tablet PC 910 may all include a PoP constructed in accordance with the disclosure. Other exemplary electronic systems such as a music player, a video player, a communication device, and a personal computer may also be configured with PoPs in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A device, comprising:
    a first package substrate having a window extending entirely through the first package substrate;
    a first package die;
    a plurality of first interconnects in direct contact with both the first package substrate and the first package die, wherein the plurality of first interconnects is configured to provide a first electrical connection for a first signal between the first package die and the first package substrate;
    a second package substrate interconnected to the first package substrate through a plurality of package-to-package interconnects, the first package substrate comprising a first surface facing the second package substrate and a second surface facing away from the second package substrate;
    a second package die;
    a plurality of second interconnects in direct contact with both the second package substrate and the second package die, wherein the plurality of second interconnects is configured to provide a direct second electrical connection for a second signal between the second package die and the second package substrate, and wherein the second package die is disposed at least partially within the window; and
    a mold compound configured to encapsulate the second package die and to have a surface aligned in a plane with the second surface of the first package substrate, wherein the mold compound is further configured to encapsulate the package-to-package interconnects.

2. The device of claim 1, wherein the plurality of second interconnects are flip-chip interconnects.

3. The device of claim 1, wherein the first package die is attached to a mold compound surface.

4. The device of claim 3, wherein the plurality of first interconnects comprise a plurality of wire bond interconnects.

5. The device of claim 3, wherein the circuit is incorporated into at least one of a cellphone, a laptop, a tablet, a music player, a communication device, a computer, and a video player.

6. The device of claim 3, wherein the first package die comprises a plurality of first package dies.

7. The device of claim 1, wherein the second package die is mounted over the second package substrate and, wherein the second package die is substantially co-planar with the first package substrate.

8. The device of claim 1, wherein the second package die comprises an active surface that faces the second package substrate.

9. The device of claim 1, wherein the first package die comprises a first non-active surface, and the second package die comprises a second non-active surface, and wherein the first non-active surface of the first package die faces the second non-active surface of the second package die.

10. The device of claim 1, wherein the second package die is configured to be directly interconnected to the second package substrate through the plurality of second interconnects such that the first package substrate can be bypassed.

* * * * *